(12) United States Patent
DeJean et al.

(10) Patent No.: US 8,766,657 B2
(45) Date of Patent: Jul. 1, 2014

(54) RF PROXIMITY SENSOR

(75) Inventors: Gerald DeJean, Redmond, WA (US); Trang Thai, Atlanta, GA (US)

(73) Assignee: Microsoft Corporation, Redmond, WA (US)

( * ) Notice: Subject to any disclaimer, the term of this patent is extended or adjusted under 35 U.S.C. 154(b) by 299 days.

(21) Appl. No.: 13/214,025

(22) Filed: Aug. 19, 2011

(65) Prior Publication Data

US 2012/0319760 A1 Dec. 20, 2012

Related U.S. Application Data

(60) Provisional application No. 61/498,417, filed on Jun. 17, 2011.

(51) Int. Cl.
*G01R 31/312* (2006.01)
(52) U.S. Cl.
USPC ............... 324/750.17; 324/754.28; 324/519; 324/658; 324/661; 324/662; 73/724; 345/173; 345/174
(58) Field of Classification Search
USPC .......... 324/750.16–750.17, 754.28, 519, 658, 324/661, 662, 686, 681, 207.11; 345/173, 345/174, 176; 327/517; 702/150; 73/724
See application file for complete search history.

(56) References Cited

U.S. PATENT DOCUMENTS

| | | | |
|---|---|---|---|
| 4,701,727 A * | 10/1987 | Wong | 333/204 |
| 5,781,081 A * | 7/1998 | Arakawa et al. | 333/185 |
| 5,801,340 A | 9/1998 | Peter | |
| 5,986,549 A | 11/1999 | Teodorescu | |
| 6,094,981 A * | 8/2000 | Hochstein | 73/170.17 |
| 6,583,676 B2 | 6/2003 | Krah | |
| 6,650,111 B2 | 11/2003 | Christensen | |
| 6,724,324 B1 * | 4/2004 | Lambert | 341/33 |
| 6,770,901 B1 * | 8/2004 | Ogawa et al. | 250/591 |
| 6,834,251 B1 | 12/2004 | Fletcher | |
| 7,031,886 B1 | 4/2006 | Hargreaves | |
| 7,170,085 B2 * | 1/2007 | Raspopin et al. | 257/21 |
| 7,545,365 B2 | 6/2009 | Kent | |
| 7,777,478 B2 * | 8/2010 | Dai et al. | 324/109 |
| 2005/0185679 A1 * | 8/2005 | Sangawa et al. | 370/536 |
| 2007/0252485 A1 * | 11/2007 | Kawakubo et al. | 310/365 |
| 2010/0085325 A1 * | 4/2010 | King-Smith et al. | 345/174 |

(Continued)

OTHER PUBLICATIONS

Bhuiya; Design and Optimization of a Stripline Resonator Sensor for Measurement of Rubber Thickness; Published Date: Dec. 2006.

(Continued)

*Primary Examiner* — Tung X Nguyen
*Assistant Examiner* — Thang Le
(74) *Attorney, Agent, or Firm* — Steve Wight; Carole Boelitz; Micky Minhas

(57) ABSTRACT

A sensor has a strip resonator filter that energizes an emitter patch which emits an electric field out from the strip resonator filter (away from the strip resonator filter). The capacitance of the filter, or specifically the coupling capacitance and radiation pattern of the slotted patch, is altered when an object such as a finger is near the sensor. Resulting changes in a signal outputted by the filter can be used to determine how close the object is to the sensor. The strip resonator filter may be a half wavelength strip resonator coupled filter having three separate strips. The patch may have a slot and two accompanying strips. An arrangement of multiple sensors may detect the position of an object in two or three dimensions.

18 Claims, 8 Drawing Sheets

(56) References Cited

U.S. PATENT DOCUMENTS

| | | | |
|---|---|---|---|
| 2010/0328259 A1* | 12/2010 | Ishizaki et al. | 345/174 |
| 2011/0007030 A1* | 1/2011 | Mo et al. | 345/174 |
| 2011/0175671 A1* | 7/2011 | Reynolds | 327/517 |
| 2011/0199333 A1* | 8/2011 | Philipp et al. | 345/174 |
| 2012/0073390 A1* | 3/2012 | Zaghloul et al. | 73/865 |
| 2012/0146943 A1* | 6/2012 | Fairley et al. | 345/174 |

OTHER PUBLICATIONS

Zimmerman et al.; Applying Electric Field Sensing to Human-Computer Interfaces; Published Date: May 1995; CHI May 1995.

Rekimoto; SmartSkin: An Infrastructure for Freehand Manipulation on Interactive Surfaces; Date Published Apr. 2002; CHI 2002, Apr. 20-25, 2002.

Design and Optimization of a Stripline Resonator Sensor for Measurement of Rubber Thickness—Published Date: Dec. 2006 http://etd.ohiolink.edu/send-pdf.cgi/Bhuiya%20Md.%20Omar.pdf?akron1164650416.

Applying Electric Field Sensing to Human-Field Interfaces Zimmerman Published Date: May 1995.

SmartSkin: An Infrastructure for Freehand Manipulation on Interactive Surfaces Date Published Apr. 2002.

* cited by examiner

RF PROXIMITY SENSOR

CROSS-REFERENCE TO RELATED APPLICATION

This application claims the benefit of U.S. Provisional Application No. 61/498,417, filed Jun. 17, 2011, and incorporated herein by reference.

BACKGROUND

Proximity sensors have been used to sense the proximity of fingers, styluses, hands, and other objects. Proximity sensors can be used as non-touch input interfaces. Non-touch input interfaces can be helpful with numerous software applications such as free-finger key entry, free-finger gesturing or handwriting, navigation, and manual manipulation of software objects, to name a few. Proximity sensors can have practical advantages; they can enable efficient interaction on small devices that have small input areas, they can avoid the mechanical wear and tear of contact type input devices, they are unobtrusive, and they can be used for both touch and non-touch input.

A variety of types of proximity sensors have been used. Acoustic sensors, while feasible, can be affected by echoes, air currents, and humidity. Optical sensors operate by line-of-sight, require significant power, can be affected by surface texture, have a slow update rate, and involve expensive post-processing to make sensing decisions. Capacitive proximity sensors, also known as electric field sensors, are also available, but they have had low range and sensitivity, and their size has been dependent on the size of sensor electrodes.

Devices and techniques discussed below relate to capacitive based proximity sensing that may result in improved range and sensitivity in the presence of a finger or other conductive object, while possibly allowing miniaturization and low power consumption.

SUMMARY

The following summary is included only to introduce some concepts discussed in the Detailed Description below. This summary is not comprehensive and is not intended to delineate the scope of the claimed subject matter, which is set forth by the claims presented at the end.

A sensor has a strip resonator filter that energizes an emitter patch which emits an electric field out from the strip resonator filter (away from the strip resonator filter). The capacitance of the filter, or specifically the coupling capacitance and radiation pattern of the slotted patch, is altered when an object such as a finger is near the sensor. Resulting changes in a signal outputted by the filter can be used to determine how close the object is to the sensor. The strip resonator filter may be a half wavelength strip resonator coupled filter having three separate strips. The patch may have a slot and two accompanying strips. An arrangement of multiple sensors may detect the position of an object in two or three dimensions.

BRIEF DESCRIPTION OF THE DRAWINGS

The present description will be better understood from the following detailed description read in light of the accompanying drawings, wherein like reference numerals are used to designate like parts in the accompanying description.

Many of the attendant features will be explained below with reference to the following detailed description considered in connection with the accompanying drawings.

DETAILED DESCRIPTION

Figure 1:
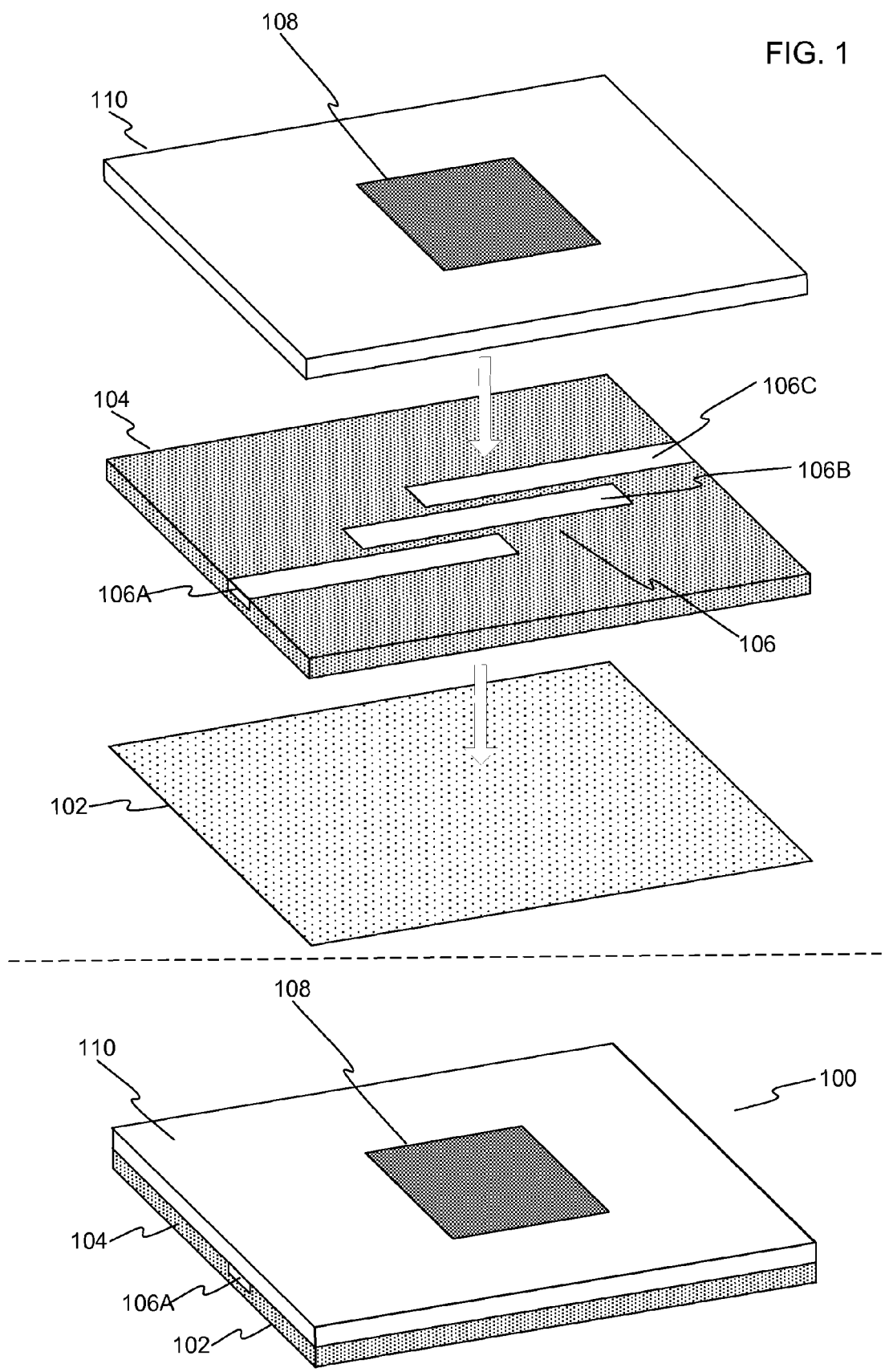
FIG. 1 shows a capacitive proximity sensor.

FIG. 1 shows a capacitive proximity sensor 100. The upper part of FIG. 1 (above the dashed line) shows elements of the capacitive proximity sensor 100 broken out for illustration. The lower part of FIG. 1 shows the capacitive proximity sensor 100 in constructed form.

In the embodiment shown in FIG. 1, a ground plane 102 of some conductive material such as copper serves as a ground for the capacitive proximity sensor 100. In an embodiment with multiple sensors (see FIGS. 7 and 8), each sensor may have its own ground plane 102, or a common ground plane 102 may be used for all of the sensors. The ground plane 102 may also be part of a larger ground plane of a circuit board on which the capacitive proximity sensor 100 resides, such ground plane serving as ground for other circuitry.

The ground plane 102 is operatively layered with a first substrate 104, which may be a material such as FR-4 or the like. The first substrate layer may have a thickness in the range of 0.004"-0.060", but thickness may vary according to material, overall size of the sensor, dielectric coefficient, and other factors. Functionally, substrate 104 separates the ground plane 102 from a half wavelength strip resonator coupled filter 106 (also to be referred to as a "strip filter", for short). That is, the first substrate, which may even be air, for example, enables the propagation of the signals on the microstrip lines.

The half wavelength strip resonator coupled filter 106 includes three individual and separate conductive strips; first outer conductive strip 106A, inner conductive strip 106B, and second outer conductive strip 106C. Other types of filters may be used, provided that sufficient energy (electric field) is directed to the opposite side of patch 108 (i.e., "above" the patch 108). The conductive strips 106A, 1068, 106C are arranged between first substrate 104 and a second substrate 110, and may be on a surface of substrate 110 and embedded in substrate 104, on a surface of substrate 104 and embedded in substrate 110, or otherwise arranged between the first substrate 104 and the second substrate 110. Note that various functionally neutral materials (adhesives, laminates, other substrates, micro wires, etc.) may reside between components of the capacitive proximity sensor 100, for example between substrates, or other components; there is no requirement that there be physical contact between first substrate 104 and second substrate 110, between first substrate 104 and/or second substrate 110 and half wavelength strip resonator coupled filter 106, between patch 108 and second substrate 110, etc.

The patch 108 is separated from the half wavelength strip resonator coupled filter 106 by the second substrate 110. The patch 108 may take various forms, as will be described later. However, in the embodiment shown in FIG. 1 the patch 108 is a simple rectangular patch of conductive material. The patch 108 is capacitively charged by the half wavelength strip resonator coupled filter 106. When an object such as a finger is near the patch 108, the electric field emitted by the patch 108 is altered, changing the reflective (capacitive) properties of the patch 108, resulting in detectable changes in frequency and/or voltage at either or both outer conductive strips 106A, 106C.

Figure 2:
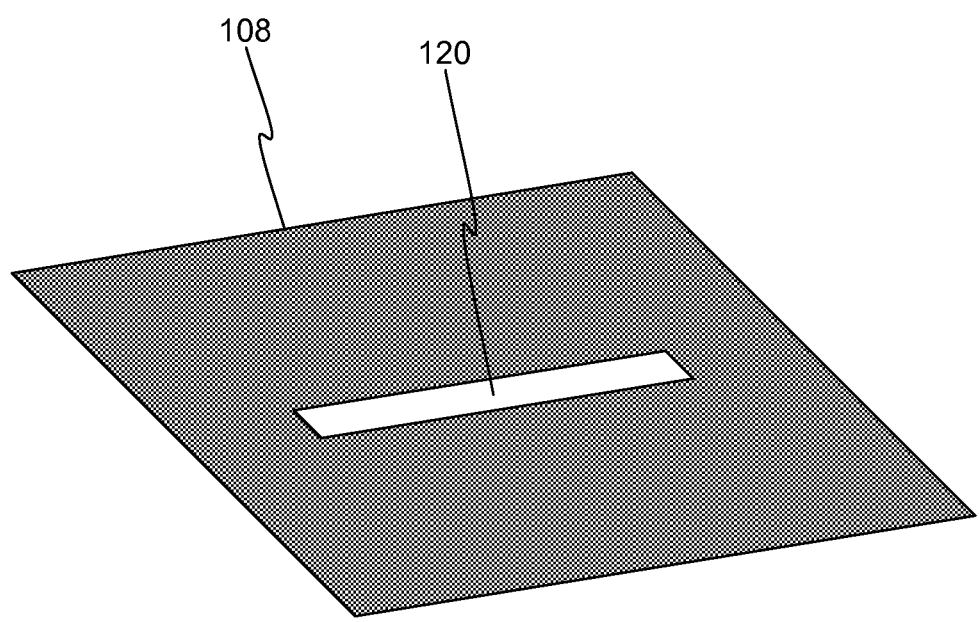
FIG. 2 shows an embodiment where a patch has a slot opening.

As mentioned, the patch 108 may take various forms. In one embodiment, patch 108 is a square with a 380 mil (9.65 mm) length side. FIG. 2 shows an embodiment where the patch 108 has a slot opening 120. Slot opening 120 may improve the responsiveness of the capacitive proximity sensor 100. The length-wise direction of slot opening 120 may be perpendicular to the length-wise direction of the strips of the half wavelength strip resonator coupled filter 106. In this embodiment, the patch 108 may have a side of length 500 mil (12.70 mm), and the slot opening 120 may be a 250 mil (6.35 mm) by 10 mil (0.25 mm) rectangle.

Figure 3:
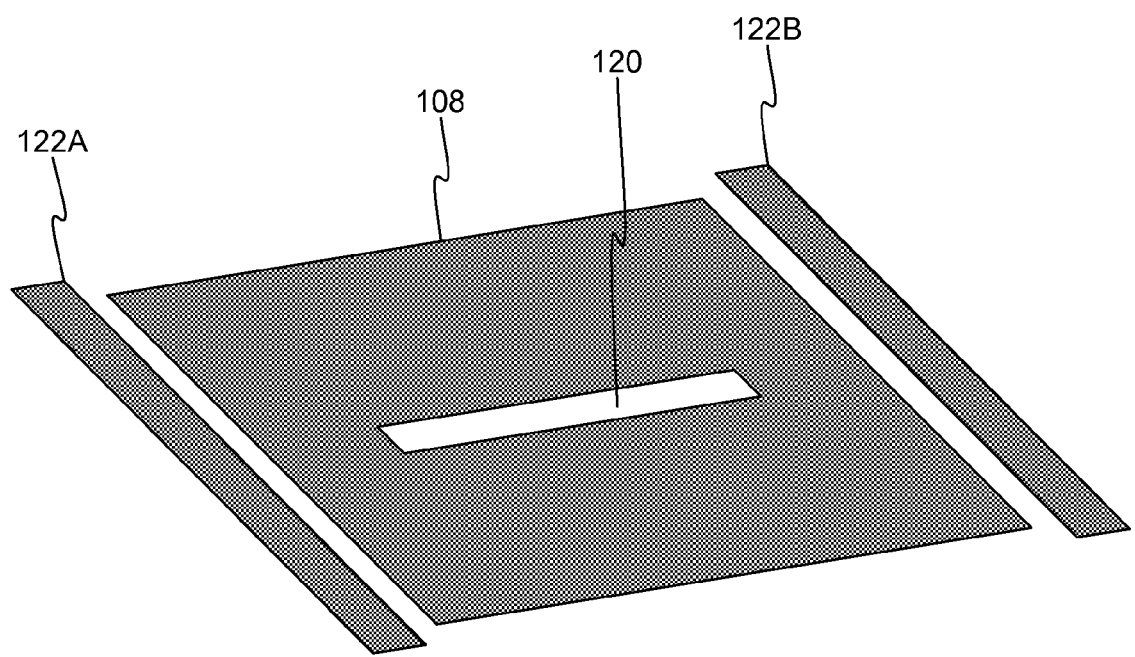
FIG. 3 shows another patch configuration.

FIG. 3 shows another patch configuration. In addition to patch 108 and slot opening 120, two parasitic strips 122A, 122B are near edges of patch 108. The parasitic strips 122A, 122B may also improve the efficiency and responsiveness of the capacitive proximity sensor 100. In one embodiment, the parasitic strips 122A, 122B are used without the slot opening 120. With this embodiment, the patch 108 may have a side of length 500 mil (12.70 mm). The slot opening 120 may have a length of 600 mil (15.24 mm) and a width of 56 mil (1.42 mm). There may be a coupling gap of 10 mil (0.25 mm) between parasitic strips 122A, 122B and the patch 108. A finger or other object acts as a conductive object that modifies the coupling effect between the parasitic strips 122A, 122B and the patch 108, and between the patch 108 and the half wavelength strip resonator coupled filter 106 below it. Also, the finger affects the radiation field of the patch 108 and the parasitic strips 122A, 122B positioned close to the sides of the slotted patch 108. Both factors contribute to shift the resonant frequency of the half wavelength strip resonator coupled filter 106.

Figure 4:
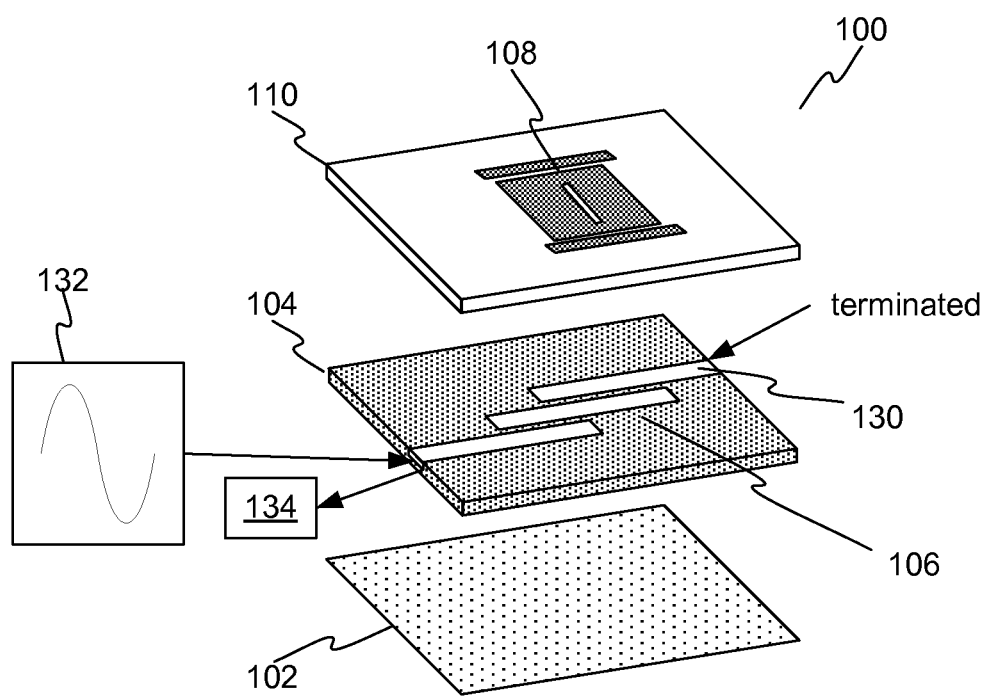
FIG. 4 shows a capacitive proximity sensor with a terminated strip that measures reflected signal.

FIG. 4 shows capacitive proximity sensor 100 with a terminated strip 130. In this embodiment the strip filter is powered by a power source 132, which may supply a signal of anywhere from 6.5 GHz to 6.7 GHz. The powered filter in turn energizes the patch 108 (as well as parasitic strips and/or a slot opening, in varying embodiments). A reflection measurement circuit 134 measures the reflected signal from the strip filter. Energy and or frequency may be measured. In one embodiment, voltage may be measured at different frequencies. The energy and frequency of the reflected signal will depend on both the supply frequency and power, nearness of any object to the sensor, and numerous factors.

Generally, in terms of frequency of the reflected signal, when there is no object near the sensor, a reflected reference signal with frequency of 6.6 GHz is detected (at approximately −6 dB). When an object is within 20 mm, a minor frequency shift may occur (i.e., a difference in frequency between the supply signal and the reflected signal), but the reflected signal may strengthen by 0.5 dB. When an object is within 10 mm, relative to the reference signal, the reflected signal is approximately 25 MHz greater (there is a 25 MHz shift), with a power of approximately −7.2 dB. When the object is within 5 mm of the sensor, the reflected signal may be 100 MHz greater than the reference signal, with relative reflected power around −6 dB. At 2 mm, a similar frequency shift occurs; with power around −5 dB. Thus, it can be seen that with a terminated filter strip, proximity can be determined from frequency shifts and/or changes in power; different sensed values indicate corresponding different distances of an object.

Figure 5:
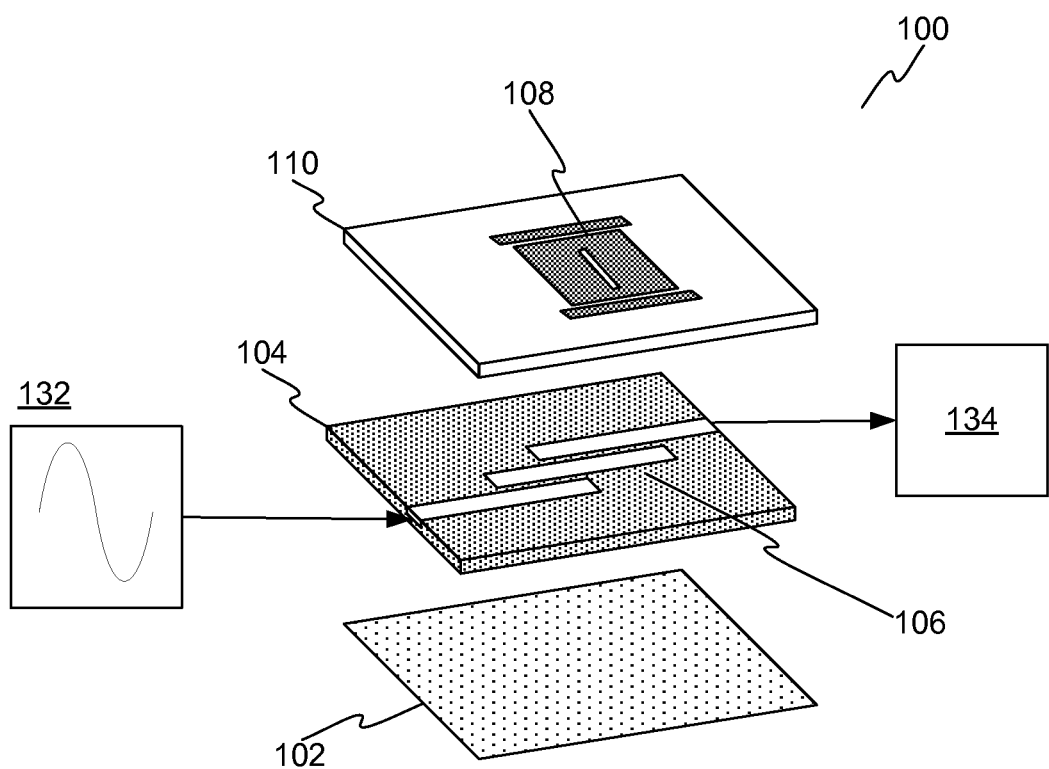
FIG. 5 shows a sensor embodiment that measures a signal transmitted through a half wavelength strip resonator coupled filter, which is not terminated.

FIG. 5 shows a sensor embodiment that measures a signal transmitted through the half wavelength strip resonator coupled filter 106, which is not terminated. With this embodiment, a transmission measurement circuit 140 measures frequency and/or power transmitted through the half wavelength strip resonator coupled filter 106. Voltage rather than current may be a convenient measure of power, due to lower power requirement and lower noise. Operating at a range of around 6.3 to 6.7 GHz, a ratio of voltage of the signal supplied by the power source 132 (to in input terminal or port) can be evaluated. By monitoring the voltage level at different frequencies, displacement of a finger above the sensor can be estimated. As noted, sensing voltage level at distinct frequencies consumes significantly less power than sensing current level, and is also less susceptible to noise.

At around 6.6 GHz, a reference measurement when no finger is present may indicate around −6.5 dB voltage lost by absorption. A finger about 20 mm distant may result in about 1.5 dB increase in lost voltage (relative to the reference signal). A finger about 10 mm distant may result in a 2 dB decrease in lost voltage.

Figure 6:
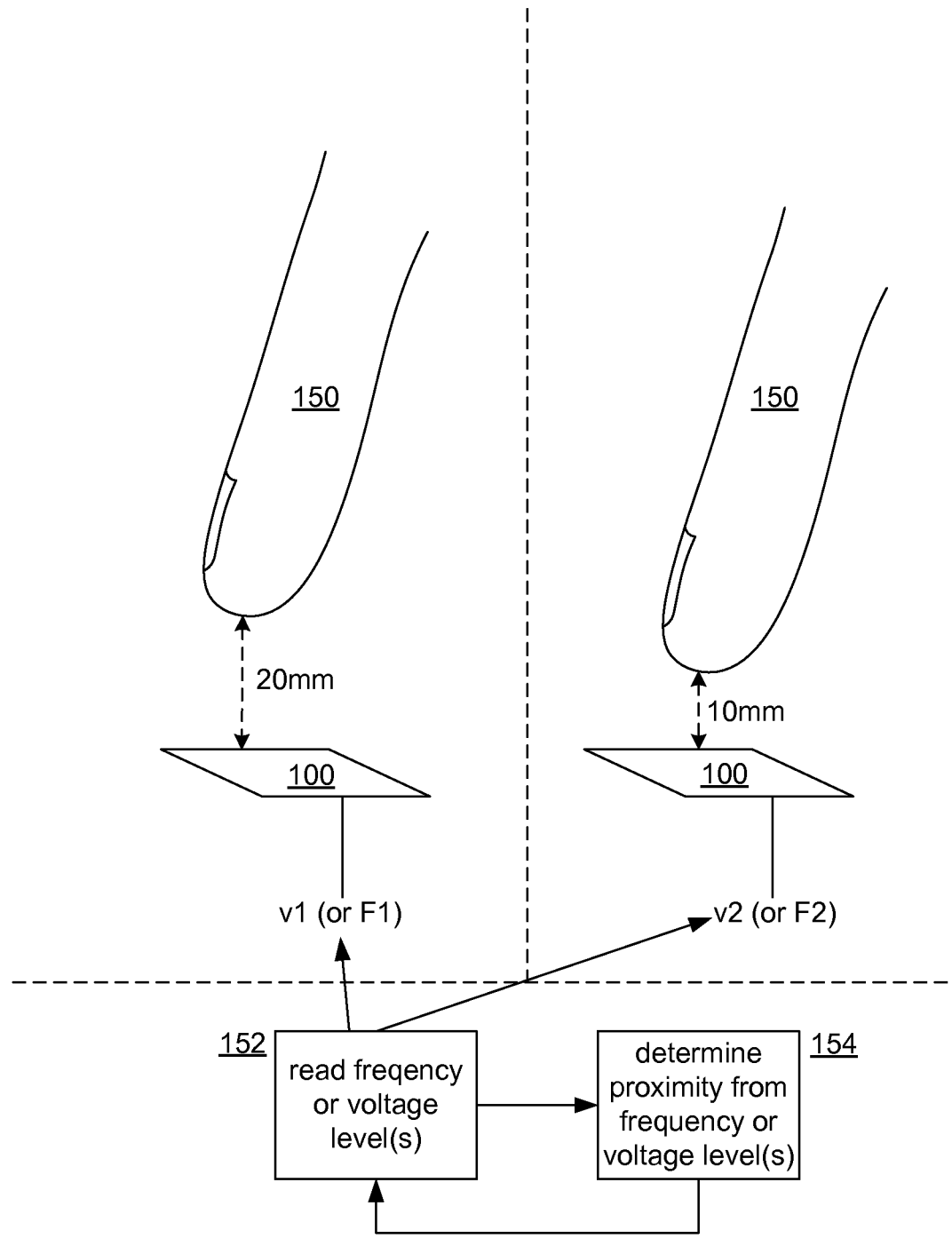
FIG. 6 shows how proximity of an object such as a finger can be determined from readings of various embodiments of the capacitive proximity sensor.

FIG. 6 shows how proximity of an object such as a finger 150 can be determined from readings of various embodiments of the capacitive proximity sensor 100. At a step 152, a pass-through or reflected signal is measured as the presence of the finger 150 shifts the resonant frequency of the filter structure, as described above. At step 154, based on the measured signal of one sensor, a one-dimensional estimate of object proximity can be computed. In other words, a z-axis measure is ultimately outputted.

To determine proximity, two parameters, peak frequency and magnitude of the signal (voltage), of the frequency response of the transducer can be tracked. Consider a VCO (voltage controlled oscillator) generating signals between 6-7 GHz through the sensor. The output signals can be amplified with constant gain, and peak frequency is detected and tracked with a phase lock loop circuit (or equivalent circuit). If the peak frequency is shifted, the shift indicates the new relative proximity from the previously known estimation. If the peak frequency is constant, but the magnitude changed, then the new relative proximity can also be estimated. For example, if from 2 mm to 5 mm the peak frequency is shifted lower and the magnitude is increased, the same response applies to the response for 5 mm to 10 mm. From 10 mm to 20 mm or further, the peak frequency is negligibly shifted lower, which can be considered as constant (depending on the complexity of the processing circuits) but the magnitude is decreased in a consistent and distinguishable manner.

Figure 7:
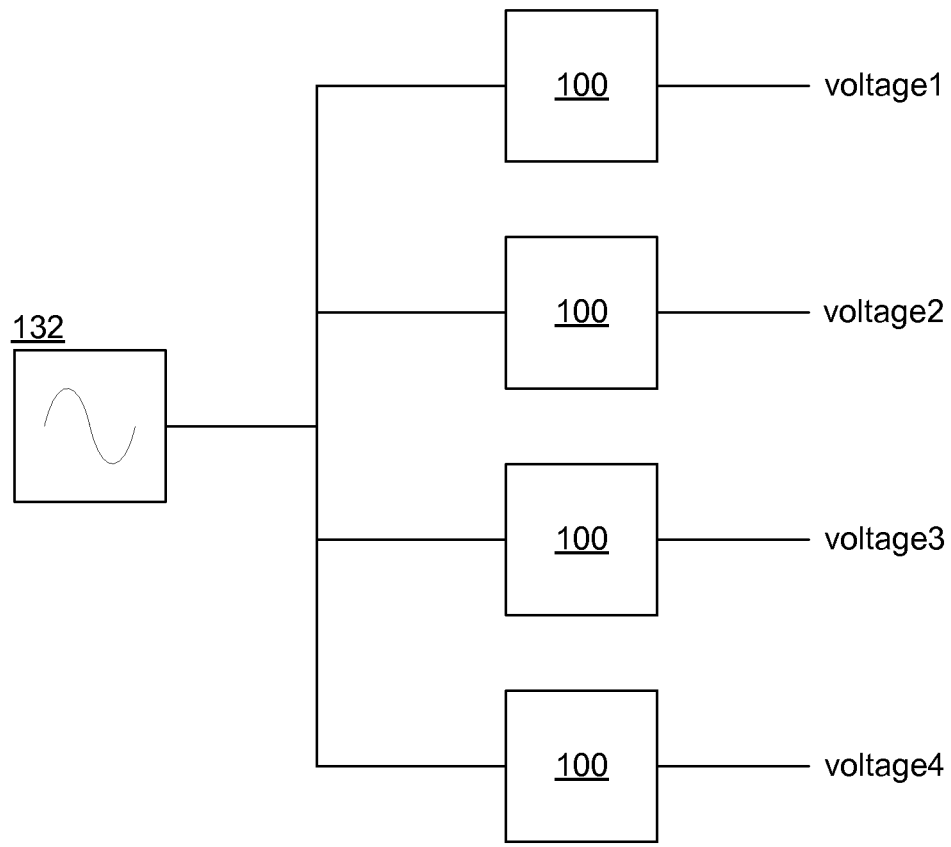
FIG. 7 shows a multi-sensor embodiment.

FIG. 7 shows a multi-sensor embodiment. This type of arrangement can be used to produce positional estimates of two or three dimensions. A plurality of capacitive proximity sensors 100 is provided. The sensors may share common substrates, ground planes, etc. or may have individual separate components. Power source 132 can supply power to each capacitive proximity sensor 100, as discussed above. A proximity measure may be produced for each sensor, for example, voltage1 through voltage4 for respective sensors. The proximity measures of each sensor can be interpolated as a whole to estimate a location of a nearby object in three dimensions. While FIG. 7 shows a pass-through measurement, the sensors can be terminated and reflected signals can be measured, as explained above.

Figure 8:
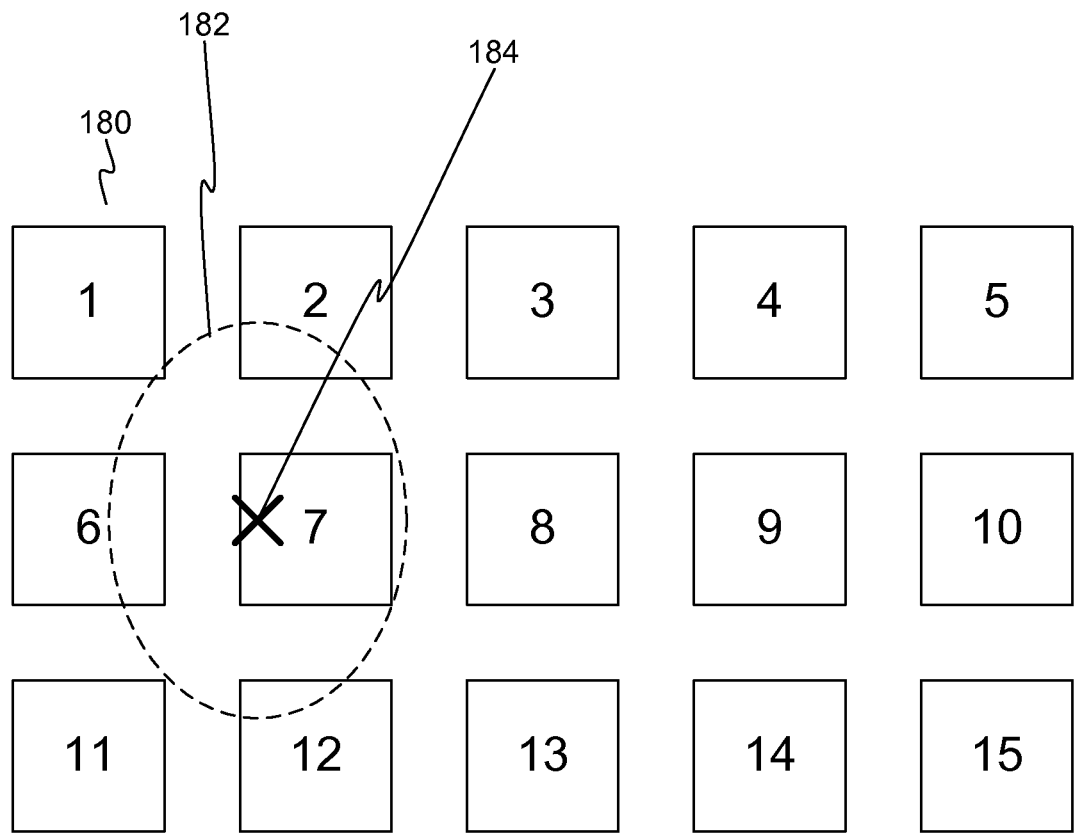
FIG. 8 shows another multi-sensor embodiment.

FIG. 8 shows another multi-sensor embodiment. Sensors are arranged in a mesh or array 180 (i.e., in a regular pattern such as in a rectilinear grid, etc.). Oval 182 represents a nearby finger tip above the array of sensors 180. Signals of the sensors are monitored and when a finger or the like is nearby as indicated by oval 182, estimated scalar readings for sensors, as denoted (sensor, reading) are: (1, 0.1), (2, 0.3), (6, 0.4), (7, 1.0), (11, 0.05), (12, 0.2). A two-dimensional position 184 (e.g., a point on the array of sensors 180) is computed form the relative strengths of the respective sensor scalar values and their known locations. A height or z-dimension of the finger is computed from the magnitudes of the scalar values. Multiple proximate objects can be detected at the same time.

As mentioned in the Background, there are many applications for the single sensor and also for an array of sensors. Touchless buttons and keys, non-touch free-finger interfaces, three-dimensional non-touch input, input surfaces that respond to both touch and proximity, and so on.

It will be appreciated that variations in dimension, material, and minor variations in form and layout of embodiments described herein are possible while still providing practical and efficient capacitive-type proximity detection.

The invention claimed is:

1. A sensor comprising:
a first substrate layer;
a second substrate layer;
a half wavelength strip resonator between the first substrate layer and the second substrate layer; and
a conductive patch and a pair of parasitic strips, the patch and the parasitic strips separated from the half wavelength strip resonator by the second substrate layer, wherein the strips are arranged such that the patch is between the parasitic strips, wherein the conductive patch comprises a conductive island that is not conductively connected with any other conductor of the sensor.

2. A sensor according to claim 1, the conductive patch further comprising an opening within the patch.

3. A sensor according to claim 1, the patch having a rectangular shape.

4. A sensor according to claim 3, the strips comprising rectangles of conductive material.

5. A sensor according to claim 1, the half wavelength strip resonator comprising two outer strips and an inner strip, all mutually parallel in a given direction, wherein the strips are not conductively connected to each other.

6. A sensor according to claim 1, wherein the half wavelength strip resonator couples energy with the conductive patch when the sensor is powered.

7. A sensor according to claim 1, wherein the half wavelength strip resonator comprises a first terminal and a second terminal, and power is supplied to the first terminal.

8. A sensor comprising:
a first substrate layer;
a second substrate layer;
a half wavelength strip resonator between the first substrate layer and the second substrate layer; and
a conductive patch and a pair of parasitic strips, the patch and the parasitic strips separated from the half wavelength strip by the second substrate layer, wherein the strips are arranged such that the patch is between the parasitic strips, wherein the half wavelength strip resonator comprises a first terminal and a second terminal, wherein power is supplied to the first terminal, and wherein the second terminal is terminated to reflect a signal back through the half wavelength strip resonator to be measured at or beyond the first terminal.

9. A sensor comprising:
a first substrate layer;
a second substrate layer;
a half wavelength strip resonator between the first substrate layer and the second substrate layer; and
a conductive patch and a pair of parasitic strips, the patch and the parasitic strips separated from the half wavelength strip by the second substrate layer, wherein the strips are arranged such that the patch is between the parasitic strips, wherein the half wavelength strip resonator comprises a first terminal and a second terminal, wherein power is supplied to the first terminal, and, wherein the second terminal is connected with circuitry that measures voltage and/or frequency of the second terminal.

10. A sensor according to claim 1, further comprising a second sensor comprised of a second half wavelength strip resonator and a second corresponding patch energized by the second half wavelength strip.

11. A sensor according to claim 10, wherein the sensor and the second sensor are members of a grid of sensors each comprising respective patches and respective halve wavelength strip filters.

12. A sensor comprising:
a half wavelength strip filter comprised of a conductive first strip, a conductive second strip, and a conductive third strip, the first strip having a first terminal connected with a power source capable of supplying power;
an emitter comprising a conductive patch and two accompanying conductive parasitic strips operatively coupled with the patch but not contacting the patch, wherein when the power source supplies power to the half wavelength strip filter, the strip filter capacitively energizes the emitter causing the emitter to emit an electric field; and
a first substrate between the half wavelength strip filter and the emitter.

13. A sensor according to claim 12, further comprising a circuit that measures proximity of an object near the sensor based on a signal at the first terminal when the power source supplies power.

14. A sensor according to claim 12, further comprising a measurement circuit, the third strip further comprising a second terminal that either terminates the third strip and reflects a signal back through half wavelength strip filter to the measurement circuit, or instead passes the signal beyond the half wavelength strip filter to the measurement circuit.

15. A sensor according to claim 12, wherein the first strip does not contact the second strip, the first strip does not contact the third strip, and the second strip does not contact the third strip.

16. A sensor according to claim 12, wherein the patch comprises a slot opening that is perpendicular to the parasitic strips, the parasitic strips each parallel to respective parallel outer edges of the conductive patch and not contacting the conductive patch.

17. A sensor according to claim 1, wherein each parasitic strip comprises a respective conductive island not conductively connected with any other electrical components of the sensor.

18. A sensor according to claim 1, wherein when the sensor is powered, sensing is provided by a circuit of the half wavelength resonator, the circuit not including the patch or the parasitic strips.

* * * * *